(12) United States Patent
Nakatsuji

(10) Patent No.: US 12,557,552 B2
(45) Date of Patent: Feb. 17, 2026

(54) THERMOELECTRIC CONVERSION ELEMENT AND THERMOELECTRIC CONVERSION DEVICE

(71) Applicant: The University of Tokyo, Tokyo (JP)

(72) Inventor: Satoru Nakatsuji, Tokyo (JP)

(73) Assignee: The University of Tokyo, Tokyo (JP)

( * ) Notice: Subject to any disclaimer, the term of this patent is extended or adjusted under 35 U.S.C. 154(b) by 292 days.

(21) Appl. No.: 17/920,354

(22) PCT Filed: Apr. 23, 2021

(86) PCT No.: PCT/JP2021/016462
§ 371 (c)(1),
(2) Date: Dec. 7, 2022

(87) PCT Pub. No.: WO2021/215529
PCT Pub. Date: Oct. 28, 2021

(65) Prior Publication Data
US 2023/0180614 A1 Jun. 8, 2023

Related U.S. Application Data

(60) Provisional application No. 63/014,653, filed on Apr. 23, 2020.

(51) Int. Cl.
*H10N 15/20* (2023.01)

(52) U.S. Cl.
CPC .................... *H10N 15/20* (2023.02)

(58) Field of Classification Search
CPC ...... H10N 15/20; H10N 15/00; H01F 10/126; H01F 10/14; H01F 10/18
See application file for complete search history.

(56) References Cited

U.S. PATENT DOCUMENTS

2020/0313062 A1* 10/2020 Iwasaki .................. H10D 48/40

FOREIGN PATENT DOCUMENTS

| JP | 2017-084854 A | 5/2017 |
|----|---------------|--------|
| WO | 2014/118959 | 8/2014 |

(Continued)

OTHER PUBLICATIONS

Szymanski et al., Prediction of improved magnetization and stability in Fe16N2 through alloying, Nov. 25, 2019, J. Appl. Phys. 126, 093903 (Year: 2019).*

(Continued)

*Primary Examiner* — Tulsidas C Patel
*Assistant Examiner* — Joshua Kiel M Rodriguez
(74) *Attorney, Agent, or Firm* — Fox Rothschild LLP; Carol E. Thorstad-Forsyth

(57) ABSTRACT

A thermoelectric conversion element is made of an alloy including a transition metal. The alloy is a compound having a crystal structure including a Kagome lattice plane constituted by the transition metal, and exhibits an anomalous Nernst effect. A thermoelectric conversion device includes a substrate and a plurality of thermoelectric conversion elements on the substrate. Each of the plurality of thermoelectric conversion elements is defined as the thermoelectric conversion element described above and has a shape extending in one direction. The plurality of thermoelectric conversion elements are arranged in parallel in a direction perpendicular to the one direction and electrically connected in series.

11 Claims, 14 Drawing Sheets

(56) References Cited

FOREIGN PATENT DOCUMENTS

| WO | 2016/181777 | 11/2016 |
| WO | 2019/009308 | 1/2019 |
| WO | 2021/215529 | 10/2021 |

OTHER PUBLICATIONS

English translation of WO-2019/009308-A1 (Year: 2019).*
Shinji Isogami et al., "Dependence of anomalous Nernst effect on crystal orientation in highly ordered γ'-Fe4N films with anti-perovskite structure," Jun. 23, 2017, Applied Physics Express, vol. 10 No. 7 (Year: 2017).*
Satya N. Guin et al., "Zero-Field Nernst Effect in a Ferromagnetic Kagome-Lattice Weyl-Semimetal Co3Sn2S2," May 1, 2019, Advanced Materials, vol. 31 Iss. 25 (Year: 2019).*
Sakai et al., "Giant anomalous Nernst effect and quantumcritical scaling in a ferromagnetic semimetal," Nature Physics, vol. 14 pp. 1119-1124 (2018).
Asaba et al., "Collossal anomalous Nernst effect in a correlated noncentrosymmetric kagome ferromagnet," Sci. Adv., 7, pp. 1-6 (2021).
Guin et al., "Zero-Field Nernst Effect in Ferromagnet Kagome-Lattice Weyl-Semimetal Co3Sn2S2," Adv. Mater., 31, 1806622, pp. 1-7 (2019).
Ikhlas et al., "Large anomalous Nernst effect at room temperature in a chiral antiferromagnet," Nature Physics, 13, pp. 1085-1091 (2017).
Khadka et al., "Anomalous Hall and Nernst effects in epitaxial films of topological kagome magnet Fe3Sn2," Physical Review Materials, 4, 084203, 7 pages (2020).
Miura et al., "Observation of anomalous Ettingshausen effect and large transverse thermoelectric conductivity in permanent magnets," Applied Physics Letters, 115, 222403, 5pages (2019).
Papaj and Fu,"Enhanced anomalous Nernst effect in disordered Dirac and Weyl materials," Phys. Rev. B, 103, pp. 1-12 (2021).
Supplementary Partial European Search Report for European Patent Application No. 21 79 2806 dated Apr. 24, 2024, 15 pages.
Zhang, "High-throughput Design of Magnetic Materials," Condensed Matter Materials Science, pp. 1-59 (2020).
Notice of Reasons for Refusal dated May 20, 2025 issued in corresponding Japanese patent application No. 2022-517110 with machine translation (9 pages).
Research Institute of Physical Properties, Graduate School of Frontier Science, "Discovery of giant anomalous Nernst effect in new technology antiferromagnet that enables power generation from heat using magnetic material," Articles, National University Corporation, University of Tokyo, 2 pages, found online at: <https://www.u-tokyo.ac.jp/focus/ja/articles/a_00602.html> (downloaded on May 12, 2025).
Ye et al., "Massive Dirac fermions in a ferromagnetic kagomemetal," Nature, vol. 555, pp. 638-642 (2018).
Decision of Refusal dated Sep. 2, 2025 issued in corresponding Japanese patent application No. 2022-517110 with machine translation (9 pages).
Miyasato et al., "Crossover Behavior of the Anomalous Hall Effect and Anomalous Nernst Effect in Itinerant Ferromagnets," The American Physical Society, Phys. Rev. Lett., 99, 086602, 4 pages (2007).

* cited by examiner

THERMOELECTRIC CONVERSION ELEMENT AND THERMOELECTRIC CONVERSION DEVICE

CROSS REFERENCE TO RELATED APPLICATIONS

This application is a U.S. National Phase Application of PCT International Application No. PCT/JP2021/016462 which was filed on Apr. 23, 2021 and claims the benefit of priority to U.S. Provisional Patent Application No. 63/014,653 which was filed on Apr. 23, 2020. The entire contents of these applications are herein incorporated by reference.

TECHNICAL FIELD

The present invention relates to a thermoelectric conversion element and a thermoelectric conversion device including the thermoelectric conversion element.

BACKGROUND ART

The Seebeck effect is known as a thermoelectric mechanism that generates an electric voltage when a temperature gradient is applied to a material (see, for example, Patent Literature 1). Unfortunately, in the thermoelectric mechanism using the Seebeck effect, main materials usable at room temperature or higher include bismuth, tellurium, lead, or the like, and thus are not suitable for practical use due to high toxicity and are not durable due to mechanical fragility and vulnerability to vibration. The Seebeck effect generates the electric voltage in the same direction as the temperature gradient, which requires a complicated three-dimensional structure in which p-type modules and n-type modules are alternately arranged and stand in a direction perpendicular to a surface of a heat source. This leads to a rise in manufacturing cost. In addition, such a three-dimensional structure makes it difficult to achieve a large-area thermoelectric module.

The anomalous Nernst effect is known as another thermoelectric mechanism that generates an electric voltage due to a temperature gradient. The anomalous Nernst effect is a phenomenon observed when a heat current flowing through a magnetic material creates a temperature difference, which generates an electric voltage in a direction perpendicular to both a magnetization direction and the temperature gradient. Recent studies have shown that topological electronic structures contribute to increasing a Nernst coefficient much higher than a previously known value (0.1 µV/K).

CITATION LIST

Patent Literature

Patent Literature 1: WO 2016/181777

SUMMARY OF INVENTION

Technical Problem

However, although various magnetic materials exhibiting the anomalous Nernst effect have been developed so far, such metal materials are relatively expensive, which leads to a high cost.

The invention has been made in view of the foregoing, and an object of the invention is to provide a thermoelectric conversion element made of an inexpensive and non-toxic material and exhibiting an anomalous Nernst effect, and provide a thermoelectric conversion device.

Solution to Problem

A thermoelectric conversion element according to one embodiment of the invention is made of an alloy including a transition metal. The alloy is a compound having a crystal structure including a Kagome lattice plane constituted by the transition metal, and exhibits an anomalous Nernst effect.

A thermoelectric conversion device according to one embodiment of the invention includes a substrate and a plurality of thermoelectric conversion elements on the substrate. Each of the plurality of thermoelectric conversion elements is defined as the thermoelectric conversion element described above, and has a shape extending in one direction. The plurality of thermoelectric conversion elements are arranged in parallel in a direction perpendicular to the one direction and electrically connected in series.

A thermoelectric conversion device according to another embodiment of the invention includes a hollow member and the thermoelectric conversion element described above. The thermoelectric conversion element is a sheet-shaped element or a wire rod covering an outer surface of the hollow member.

Advantageous Effects of Invention

According to the invention, a thermoelectric conversion element made of an inexpensive and non-toxic material is capable of exhibiting an anomalous Nernst effect.

DESCRIPTION OF EMBODIMENTS

Exemplary embodiments of the invention will be described below with reference to the accompanying drawings. The drawings are schematic, and a relationship between a plane dimension and a thickness and a ratio of the thickness between members are different from actual ones.

First, a thermoelectric conversion element according to the embodiments of the invention and a thermoelectric mechanism thereof will be described with reference to FIG. 1.

Figure 1:
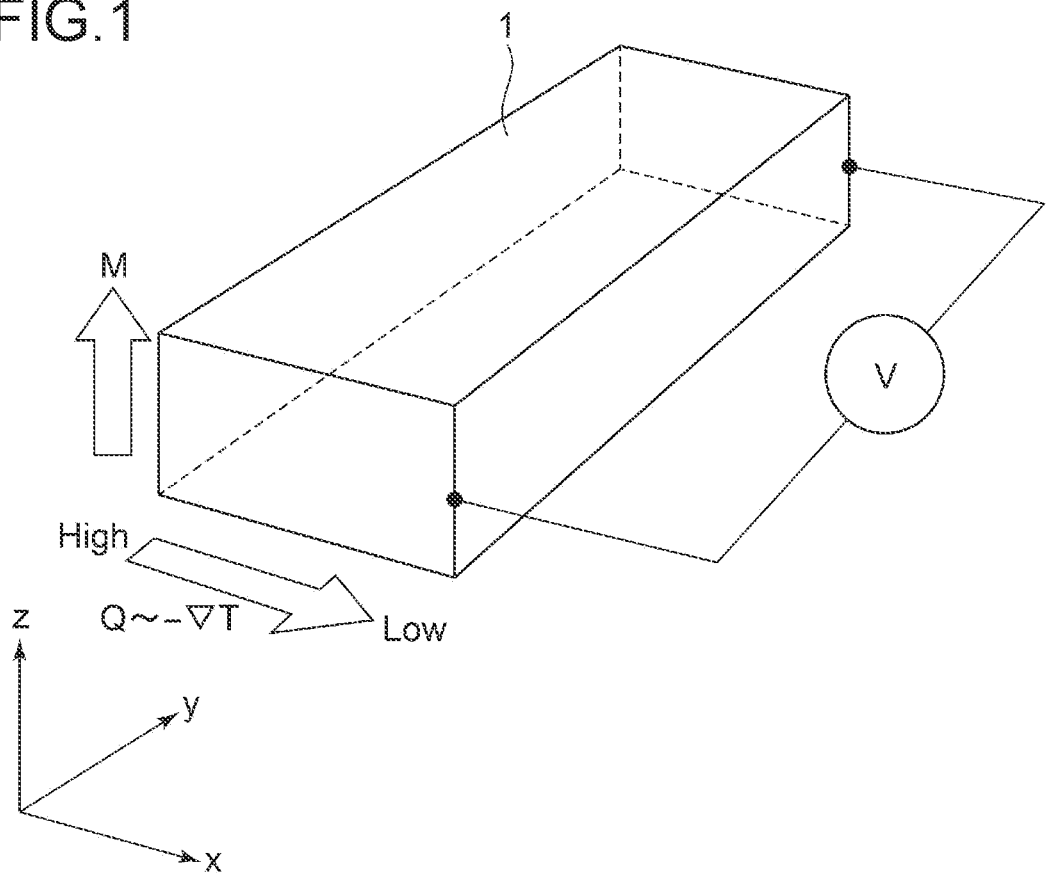
FIG. 1 is a schematic view illustrating a thermoelectric mechanism using a thermoelectric conversion element according to embodiments.

As shown in FIG. 1, a thermoelectric conversion element 1 according to the embodiments has a rectangular parallelepiped shape extending in one direction (y direction), has a predetermined thickness (length in a z direction), and is magnetized in a +z direction. When a heat current Q ($\propto -\nabla T$) flows through the thermoelectric conversion element 1 in a +x direction, a temperature difference is created in the +x direction. As a result, in the thermoelectric conversion element 1, the anomalous Nernst effect generates electromotive force V ($\propto M \times (-\nabla T)$) in an outer product direction (y direction) orthogonal to both the direction of the heat current Q (+x direction) and the direction of magnetization M (+z direction).

Among materials exhibiting the anomalous Nernst effect, $Co_2MnGa$ has a Nernst coefficient that reaches a record high value of about 6 µV/K at room temperature and about 8 µV/K at 400K, reported by the inventor of the present application (see Nature Physics 14, 1119-1124 (2018) and International Publication No. WO 2019/009308).

<$Fe_3Sn_2$>

The inventor of the present application was able to demonstrate that a Nernst coefficient of an alloy of Fe (iron) and Sn (tin), which are inexpensive and non-toxic materials, approaches the record high value.

Figure 2A:
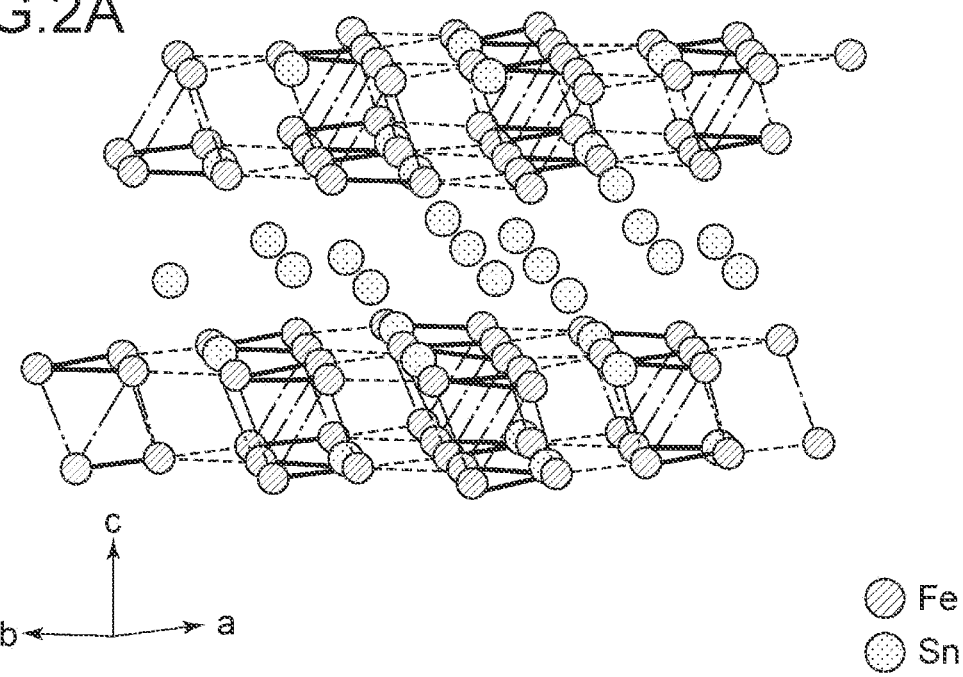
FIG. 2A is a schematic view of a crystal structure of $Fe_3Sn_2$.
Figure 2B:
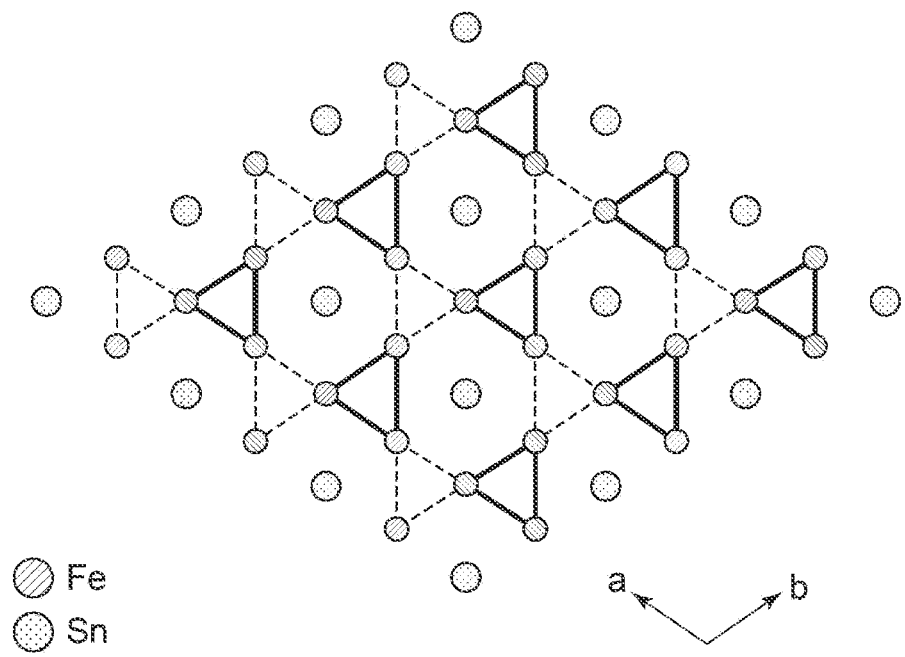
FIG. 2B is a schematic view of a crystal structure of $Fe_3Sn_2$ in an ab plane.

FIG. 2A and FIG. 2B show a crystal structure of $Fe_3Sn_2$ capable of exhibiting the anomalous Nernst effect. The crystal structure of $Fe_3Sn_2$ is composed of a Fe—Sn Kagome bilayer and a Sn layer stacking alternately along a c-axis direction. In the Fe—Sn Kagome bilayer, the Fe atoms form two Kagome lattice layers. The Sn layer has a honeycomb structure. As shown in FIG. 2A, two Fe—Sn Kagome bilayers are separated by the Sn layer. As shown in FIG. 2B, each of the Fe—Sn Kagome bilayers has two kinds of equilateral triangles with different Fe—Fe lengths (solid line, broken line), and the Sn atoms within the bilayer occupy centers of hexagons of the Kagome lattice.

Such an $Fe_3Sn_2$ ferromagnetic material can be prepared by a known method such as a self-flux method. Alternatively, a sputtering method, a molecular beam epitaxy (MBE) method, a chemical vapor deposition (CVD) method, or other such method may be employed to produce a thin film of $Fe_3Sn_2$. $Fe_3Sn_2$ may be a single crystal or a polycrystal. Because $Fe_3Sn_2$ is a very stable material, the crystal can be pulverized into powder to produce ink.

Figure 3A:
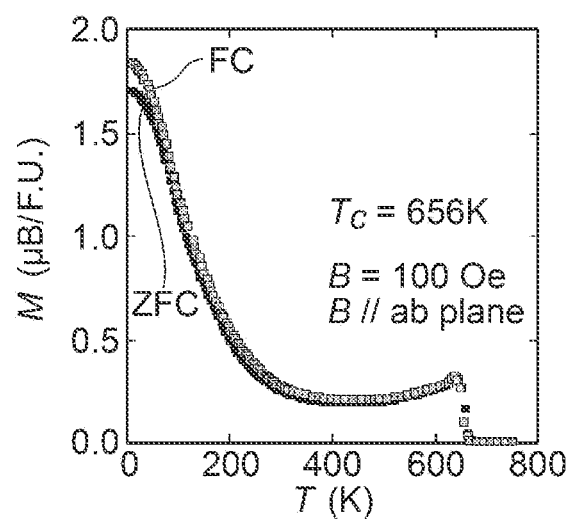
FIG. 3A is a graph illustrating temperature dependence of magnetization of $Fe_3Sn_2$ in zero-field cooling and field cooling when a magnetic field is applied parallel to the ab plane.
Figure 3B:
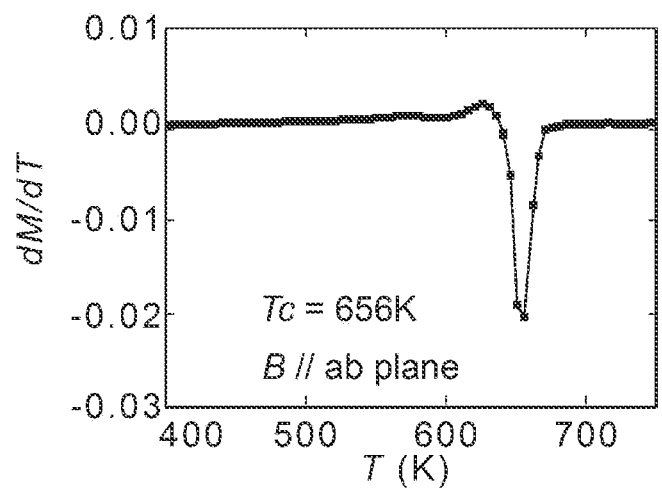
FIG. 3B is a graph illustrating a temperature derivative of the magnetization shown in FIG. 3A.
Figure 3C:
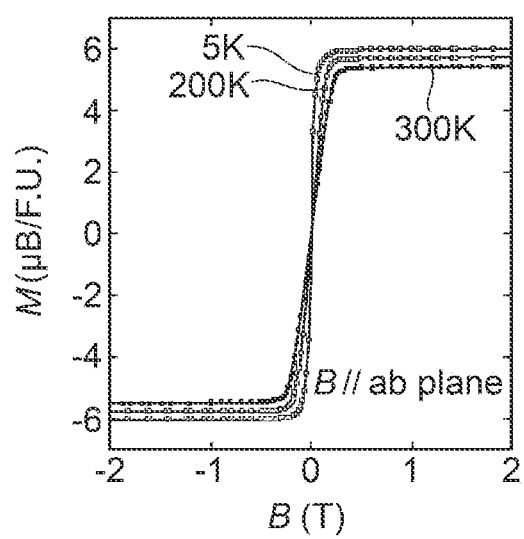
FIG. 3C is a graph illustrating magnetic field dependence of magnetization of $Fe_3Sn_2$ at 5K, 200K, and 300K when the magnetic field is applied parallel to the ab plane.

FIG. 3A shows temperature dependence of magnetization M of $Fe_3Sn_2$ in zero-field cooling (ZFC) and field cooling (FC) when a magnetic field B of 100 Oe is applied parallel to an ab plane. FIG. 3B shows a temperature derivative of the magnetization shown in FIG. 3A (dM/dT). FIG. 3C shows magnetic field dependence of the magnetization M of $Fe_3Sn_2$ at T=5K, 200K, and 300K when the magnetic field B is applied parallel to the ab plane.

FIG. 3A indicates that the magnetization in FC is slightly larger than that in ZFC at a low temperature because domains are aligned in FC while the domains are not aligned in ZFC. FIGS. 3A and 3B indicate that a transition temperature (Curie temperature) Tc of $Fe_3Sn_2$ is 656K. FIG. 3C indicates that at T=5K, saturation magnetization of $Fe_3Sn_2$ reaches 6.03 µB/F.U., and the saturation magnetization per Fe atom is 2.01 µB.

Figure 4A:
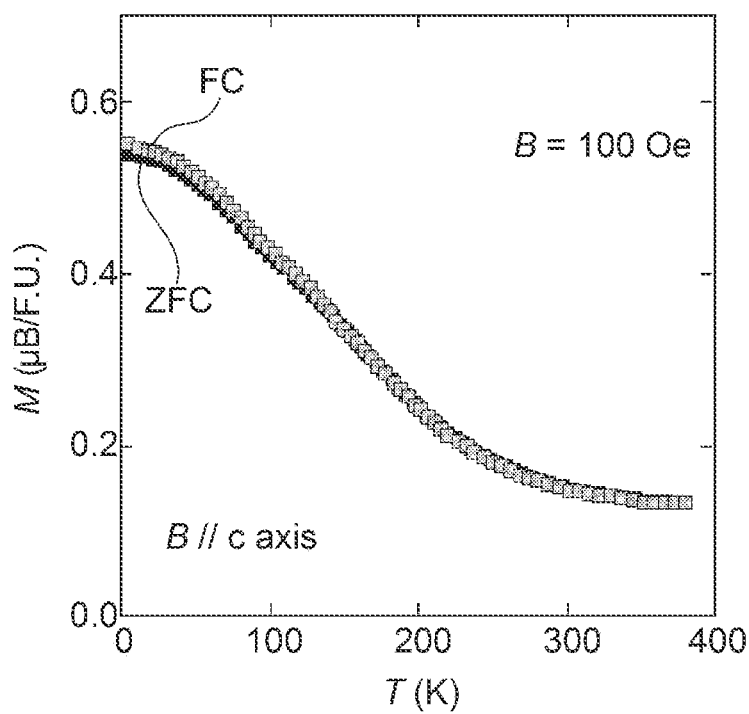
FIG. 4A is a graph illustrating temperature dependence of magnetization of $Fe_3Sn_2$ in zero-field cooling and field cooling when the magnetic field is applied parallel to a c-axis.
Figure 4B:
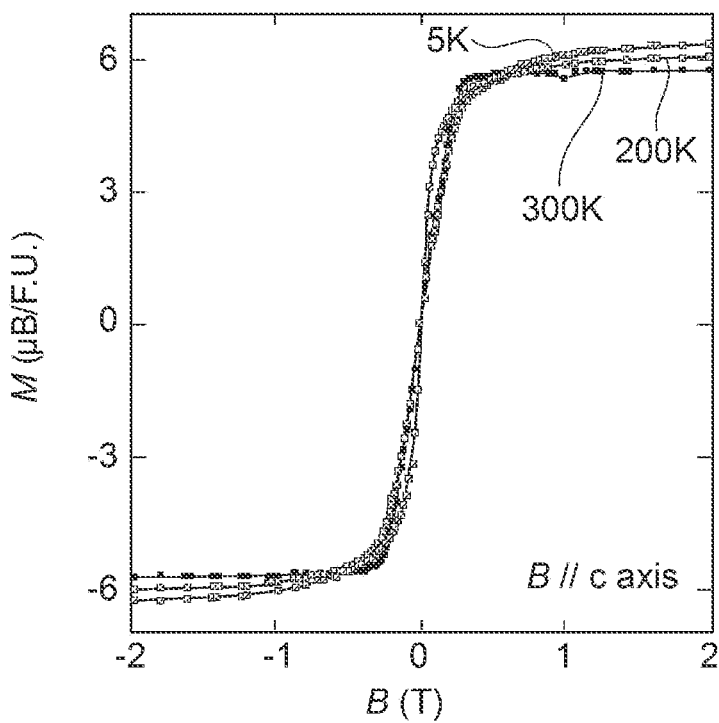
FIG. 4B is a graph illustrating magnetic field dependence of magnetization of $Fe_3Sn_2$ at 5K, 200K, and 300K when the magnetic field is applied parallel to the c-axis.

FIG. 4A shows the temperature dependence of the magnetization M of $Fe_3Sn_2$ in ZFC and FC when the magnetic field B of 100 Oe is applied parallel to the c-axis. FIG. 4B shows the magnetic field dependence of the magnetization M of $Fe_3Sn_2$ at T=5K, 200K, and 300K when the magnetic field B is applied parallel to the c-axis. FIG. 4A suggests that even at a low temperature, almost the same magnetization is observed in FC and ZFC. FIG. 4B suggests that almost the same saturation magnetization as that in FIG. 3C is observed.

Figure 5A:
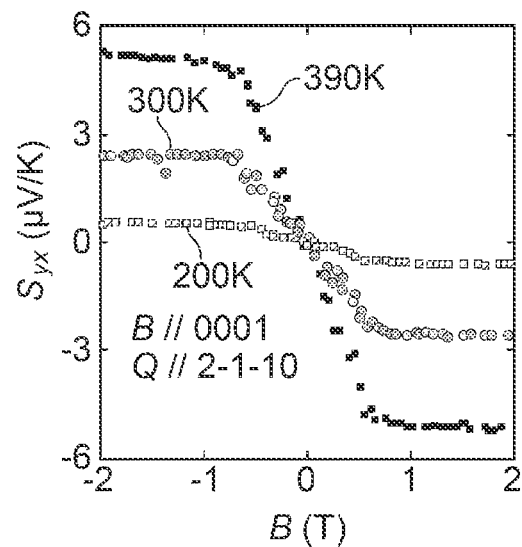
FIG. 5A is a graph illustrating magnetic field dependence of a Nernst coefficient of $Fe_3Sn_2$ at 200K, 300K, and 390K.
Figure 5B:
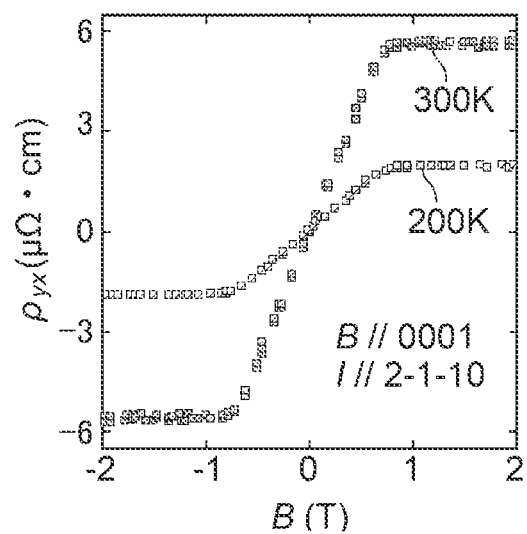
FIG. 5B is a graph illustrating magnetic field dependence of Hall resistivity of $Fe_3Sn_2$ at 200K and 300K.
Figure 5C:
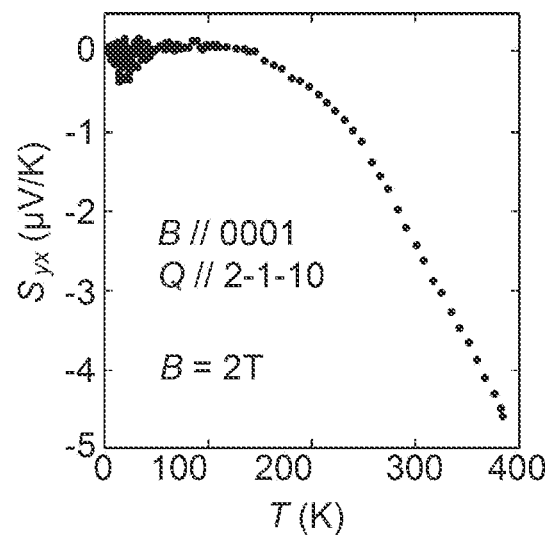
FIG. 5C is a graph illustrating temperature dependence of the Nernst coefficient of $Fe_3Sn_2$.

FIGS. 5A to 5C show results of observation of the anomalous Nernst effect and an anomalous Hall effect of $Fe_3Sn_2$. Specifically, FIG. 5A shows magnetic field dependence of a Nernst coefficient Sy. of $Fe_3Sn_2$ at T=200K, 300K, and 390K when the magnetic field B is applied parallel to [0001] and a heat current Q flows parallel to [2-1-10]. FIG. 5B shows magnetic field dependence of Hall resistivity $\rho_{yx}$ of $Fe_3Sn_2$ at T=200K and 300K when the magnetic field B is applied parallel to [0001] and a current I flows parallel to [2-1-10]. FIG. 5C shows temperature dependence of the Nernst coefficient $S_{yx}$ of $Fe_3Sn_2$ when the magnetic field B=2T is applied parallel to [0001] and the heat current Q flows parallel to [2-1-10]. Here, four integers in a square bracket represent Miller indices.

FIGS. 5A and 5C suggest that the Nernst coefficient $S_{yx}$ of $Fe_3Sn_2$ has large temperature dependence, and its absolute value $|S_{yx}|$ is about 2.4 µV/K at T=300K and reaches about 5.1 µV/K at T=390K. In addition, $|S_{yx}|$ at T=150K or lower is found to be almost zero, whereas $|S_{yx}|$ at a temperature exceeding T=150K is found to rapidly increase with increase in temperature. Further, FIG. 5B suggests that $Fe_3Sn_2$ exhibits a large anomalous Hall effect at room temperature.

As described above, a large anomalous Nernst effect can be exhibited in $Fe_3Sn_2$.

<Iron Nitride>

The inventor of the present application has further found that the anomalous Nernst effect is also exhibited in an iron nitride.

Figure 6:
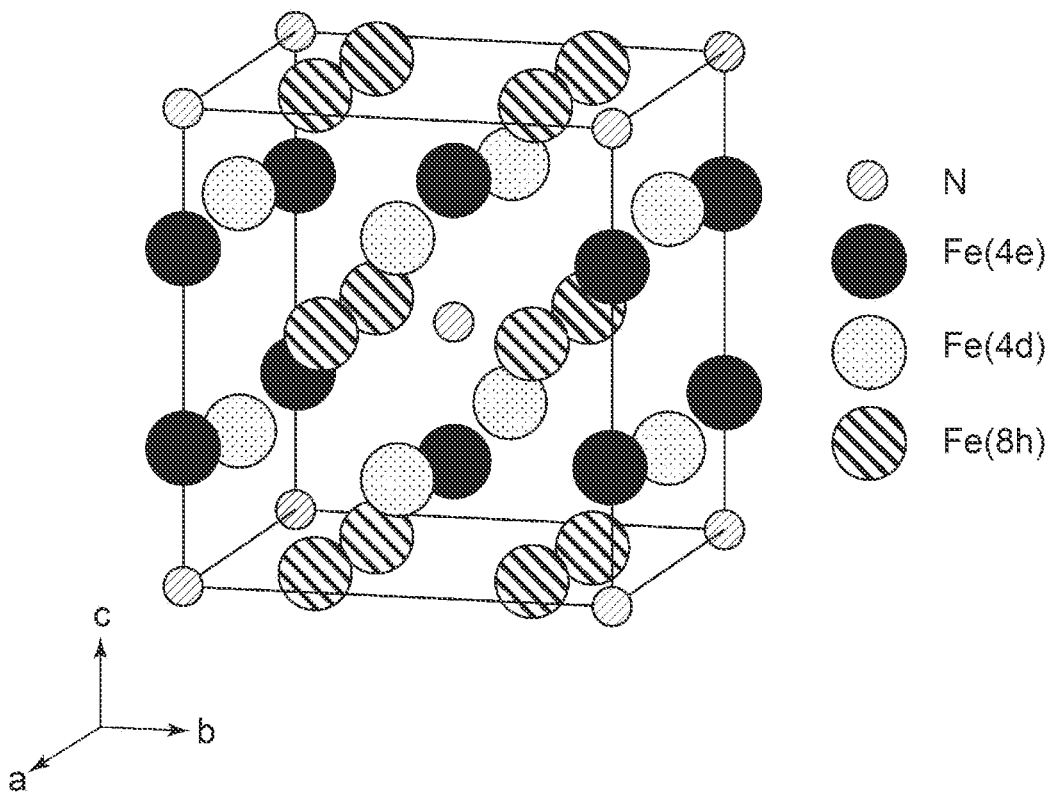
FIG. 6 is a schematic view of a crystal structure of $Fe_{16}N_2$.

FIG. 6 shows a crystal structure of $Fe_{16}N_2$ capable of exhibiting the anomalous Nernst effect. In a unit cell of $Fe_{16}N_2$, N (nitrogen) atoms have a body-centered cubic (bcc) structure, and Fe atoms occupy three crystallographically different sites ($4e$, $4d$ and $8h$). $Fe_{16}N_2$ can be prepared by a known method. For example, $Fe_{16}N_2$ can be prepared by sputtering iron in a nitrogen atmosphere.

Figure 7A:
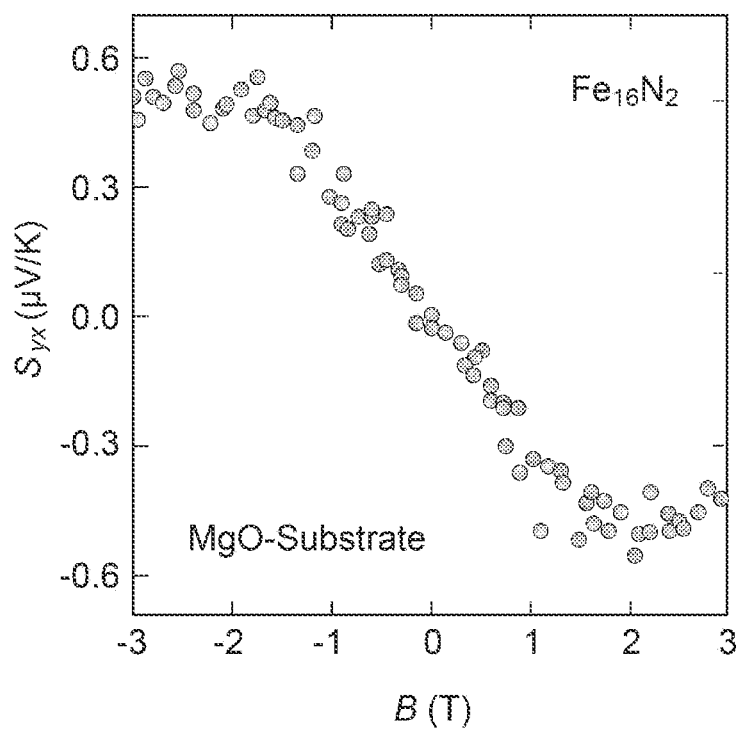
FIG. 7A is a graph illustrating magnetic field dependence of a Nernst coefficient of a first sample made of $Fe_{16}N_2$.
Figure 7B:
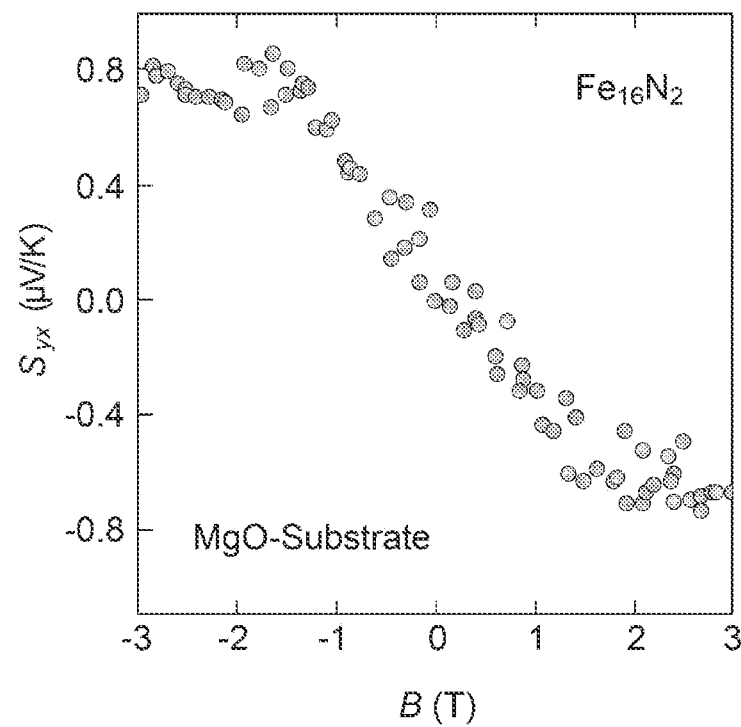
FIG. 7B is a graph illustrating magnetic field dependence of a Nernst coefficient of a second sample made of $Fe_{16}N_2$.

FIG. 7A shows magnetic field dependence of the Nernst coefficient $S_{yx}$ of a first sample made of $Fe_{16}N_2$ at T=300K. FIG. 7B shows magnetic field dependence of the Nernst coefficient $S_{yx}$ of a second sample made of $Fe_{16}N_2$ at T=300K. Although the first sample and the second sample are both prepared on substrates made of MgO, a contact state between the first sample and a terminal is different from a contact state between the second sample and a terminal. As shown in FIGS. 7A and 7B, $|S_{yx}|$ of $Fe_{16}N_2$ is about 0.6 µV/K and about 0.8 µV/K, suggesting that the anomalous Nernst effect is exhibited.

Even in an iron nitride other than $Fe_{16}N_2$, the anomalous Nernst effect is expected to be observed. For example, $Fe_4N$ has a crystal structure belonging to a space group Pm-3m, and a Curie temperature Tc is as high as 760K. By high-throughput calculation, a maximum value of a transverse thermoelectric conductivity α [A/Km] of $Fe_4N$ at Fermi energy is estimated to be 2.4 A/Km at T=500K or lower.

<R—Co Based Alloy>

Further, the inventor of the present application has found that the anomalous Nernst effect is also exhibited in an R—Co based alloy as typified by $RCo_5$. Here, R is a rare-earth element, and examples of such a rare-earth element include Y (yttrium), La (lanthanum), Ce (cerium), Pr (praseodymium), Nd (neodymium), Sm (samarium), Gd (gadolinium), Tb (terbium), Dy (dysprosium), Ho (holmium), and Er (erbium).

Figure 8:
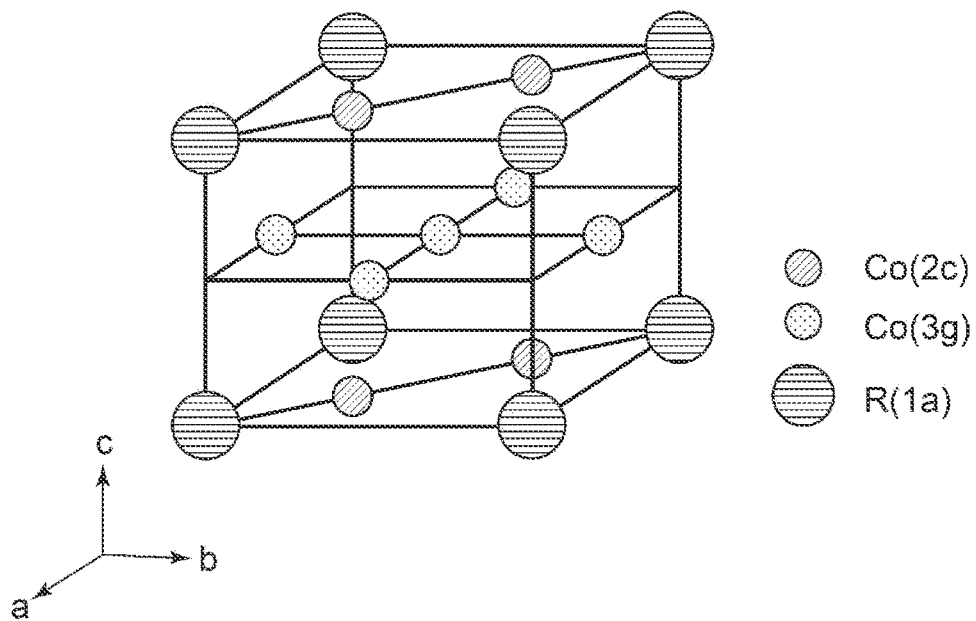
FIG. 8 is a schematic view of a crystal structure of $RCo_5$ (where R is a rare-earth element).

FIG. 8 shows a crystal structure of $RCo_5$. $RCo_5$ has a hexagonal structure with a space group P6/mmm in which an a-axis and a b-axis share the same length, an angle α between the b-axis and a c-axis and an angle β between the c-axis and the a-axis are α=β=90°, and an angle γ between the a-axis and the b-axis is γ=120°. In $RCo_5$, R atoms occupy $1a$ sites, and Co atoms occupy $2c$ sites and $3g$ sites constituting a Kagome lattice plane. Related substances of $RCo_5$ include $R_2Co_7$ and $R_2Co_{17}$.

Figure 9A:
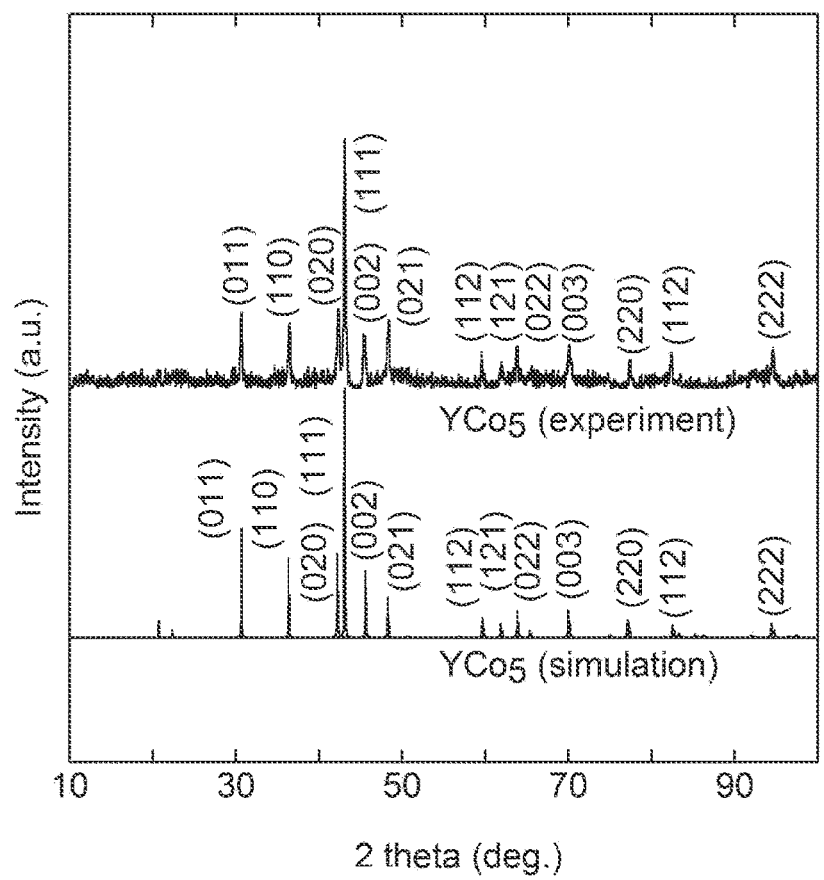
FIG. 9A is a graph illustrating an X-ray diffraction pattern of a $YCo_5$ polycrystal.

FIG. 9A shows an X-ray diffraction pattern of a $YCo_5$ polycrystal prepared by arc melting. For comparison, the X-ray diffraction pattern obtained from simulation is also shown. These X-ray diffraction patterns can confirm that the $YCo_5$ polycrystal sample has a single phase.

Figure 9B:
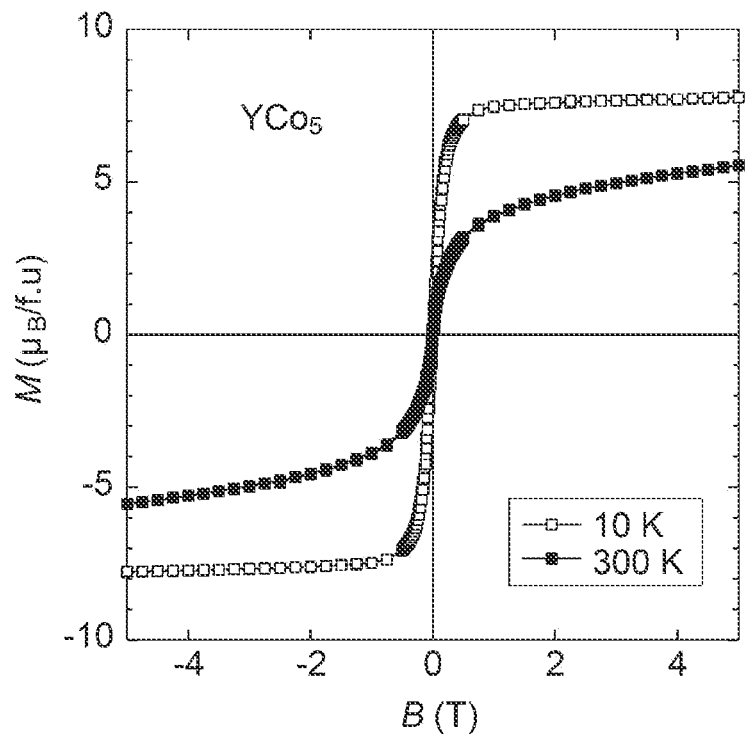
FIG. 9B is a graph illustrating magnetic field dependence of magnetization of the $YCo_5$ polycrystal at 10K and 300K.
Figure 9C:
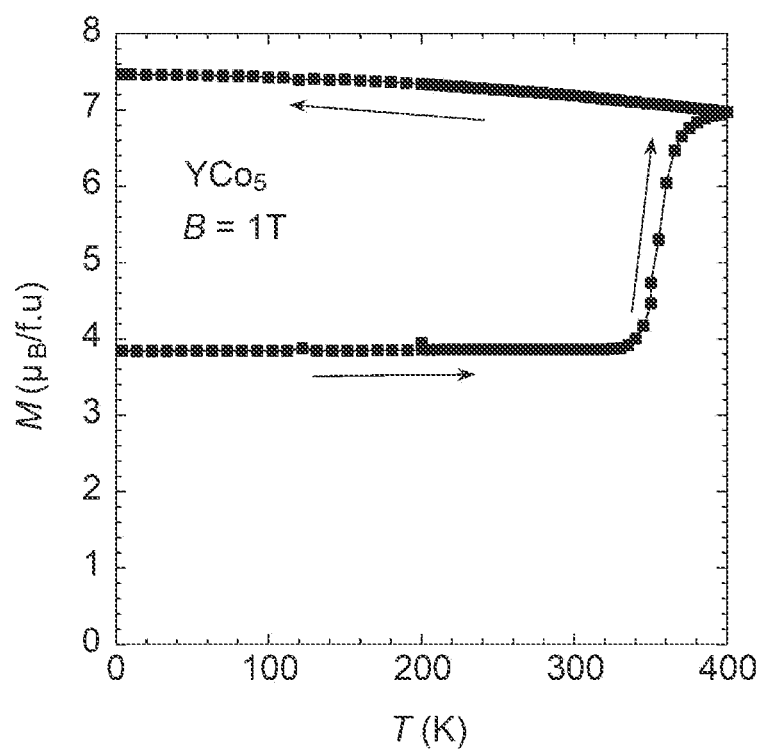
FIG. 9C is a graph illustrating temperature dependence of the magnetization of the $YCo_5$ polycrystal.

FIG. 9B shows magnetic field dependence of the magnetization M of the $YCo_5$ polycrystal at 10K and 300K. FIG. 9C shows temperature dependence of the magnetization M of the $YCo_5$ polycrystal when a magnetic field B=1T is applied. FIG. 9B and FIG. 9C can confirm that a ferromagnetic state is realized.

Figure 9D:
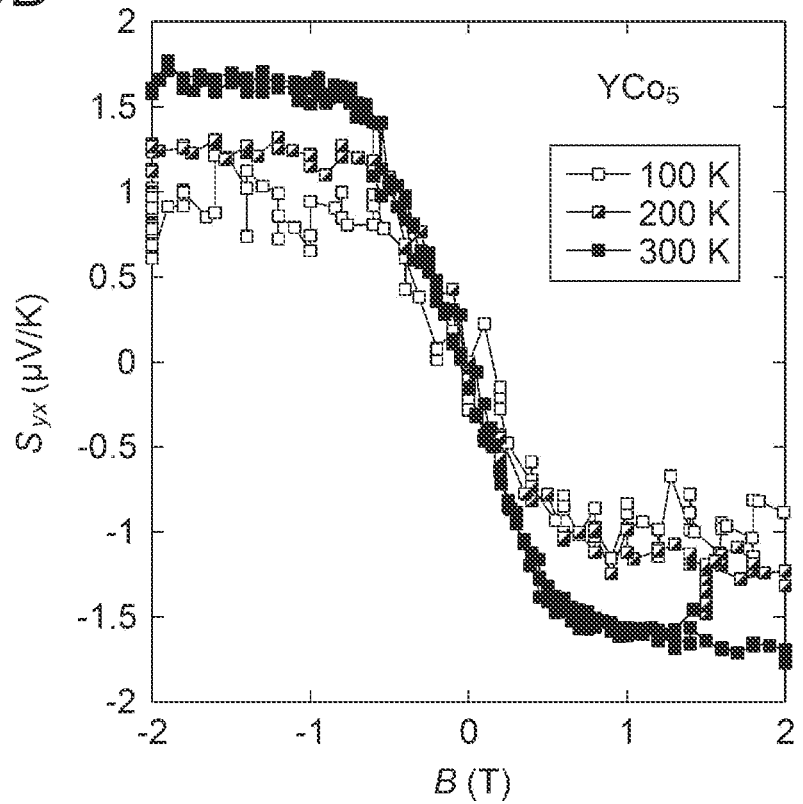
FIG. 9D is a graph illustrating magnetic field dependence of a Nernst coefficient of the $YCo_5$ polycrystal at 100K, 200K, and 300K.

FIG. 9D shows magnetic field dependence of the Nernst coefficient $S_{yx}$ of the $YCo_5$ polycrystal at 100K, 200K, and 300K. FIG. 9D indicates that $|S_{yx}|$ takes a relatively large value of 1.7 µV/K at 300K (room temperature).

In an $RCo_5$ single crystal, a larger Nernst coefficient can be obtained. Table 1 shows a composition formula, the space group, the Curie temperature Tc, the transverse thermoelectric conductivity α, and the Nernst coefficient $S_{yx}$ of the $RCo_5$ single crystal. The transverse thermoelectric conductivity α and the Nernst coefficient $S_{yx}$ shown in Table 1 are values at room temperature. Here, R=Y, Dy, Ho, Tb, Er, Gd, and Sm. As shown in Table 1, $S_{yx}$ of the $YCo_5$ single crystal at room temperature is 4.33 µV/K, which is a much larger value.

TABLE 1

| Composition Formula | Space Group | $T_c$ | α (A/mK) | $S_{yx}$ (µV/K) |
|---|---|---|---|---|
| $YCo_5$ | P6/mmm | 900K | 4.10 | 4.33 |
| $DyCo_5$ | P6/mmm | 973K | 3.49 | 3.66 |
| $HoCo_5$ | P6/mmm | ~1000K | 3.44 | 3.48 |
| $TbCo_5$ | P6/mmm | 980K | 3.34 | 3.40 |
| $ErCo_5$ | P6/mmm | 986K | 3.49 | 3.23 |
| $GdCo_5$ | P6/mmm | 1008K | 3.13 | 3.00 |
| $SmCo_5$ | P6/mmm | 1029K | 2.56 | 2.15 |

$RCo_5$ has a high Curie temperature of 900K or higher, and shows strong uniaxial magnetic anisotropy. For example, when R is La, Ce, Pr, Sm, or Y, $RCo_5$ has an easy axis in the c-axis direction at room temperature. In addition, by pulverizing particles of $RCo_5$ to particles with a single magnetic domain size, it is possible to produce a permanent magnet with large coercivity, exhibiting the Nernst effect in a zero magnetic field.

The anomalous Nernst effect can also be exhibited in a compound with a composition of $RCo_4M$. Here, M is B (boron) or Ga (gallium).

Figure 10:
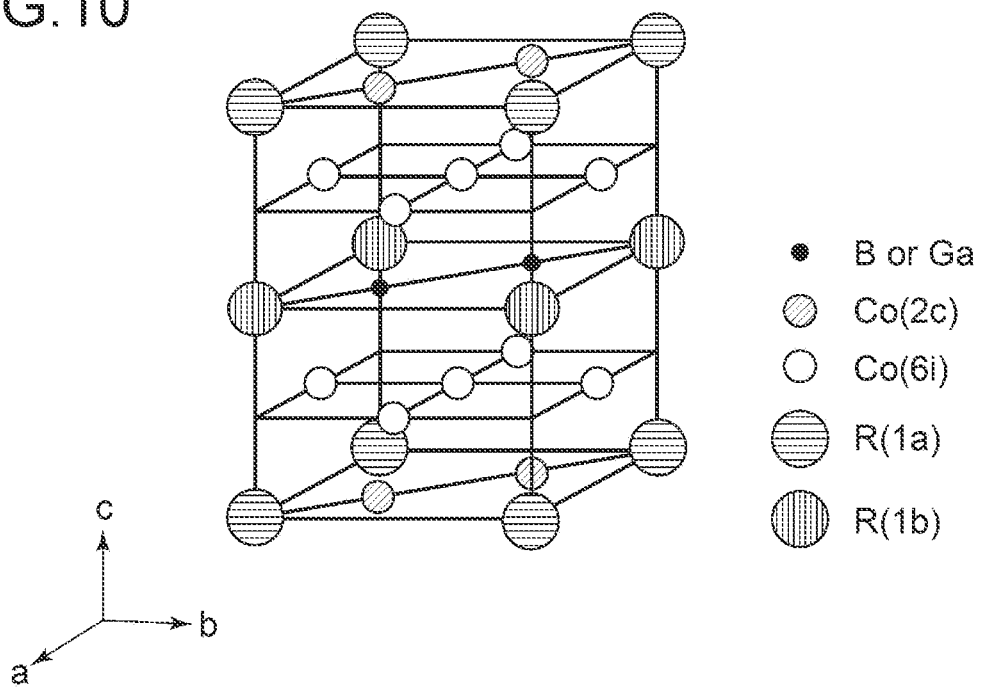
FIG. 10 is a schematic view of a crystal structure of $RCo_4M$ (where R is a rare-earth element, and M is B or Ga).

FIG. 10 shows a crystal structure of $RCo_4M$. In $RCo_4M$, the R atoms occupy $1a$ and $1b$ sites, and the Co atoms occupy $2c$ sites and $6i$ sites constituting the Kagome lattice plane.

Figure 11:
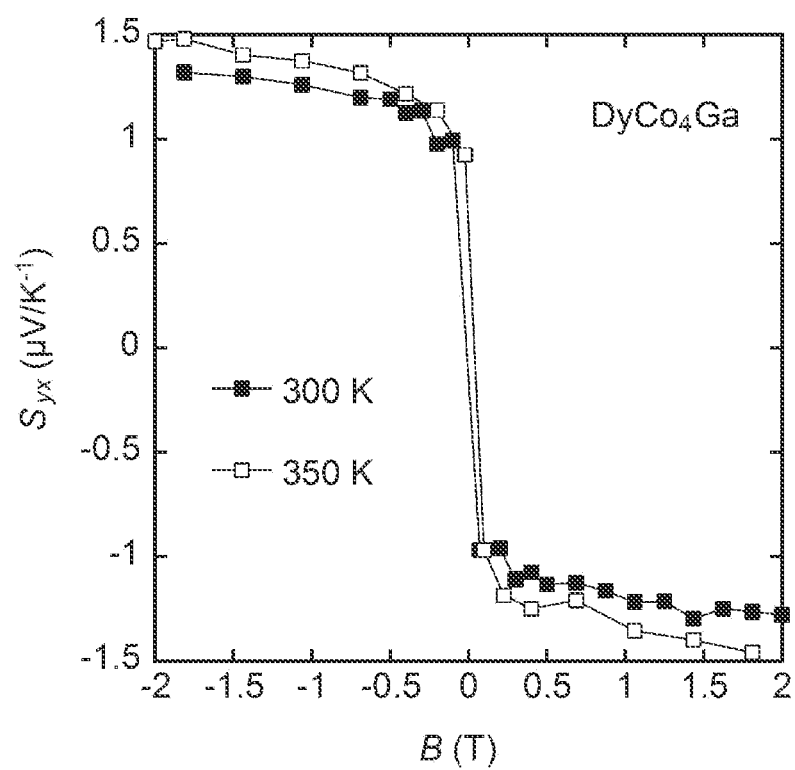
FIG. 11 is a graph illustrating magnetic field dependence of a Nernst coefficient of $DyCo_4Ga$ at 300 K and 350 K.

FIG. 11 shows magnetic field dependence of the Nernst coefficient $S_{yx}$ of $DyCo_4Ga$ at 300K and 350K. FIG. 11 indicates that $|S_{yx}|$ takes a relatively large value of 1.5 µV/K at 350K.

In addition to $RCo_5$ and $RCo_4M$ described above, a large Nernst coefficient value can also be obtained for $R_2Co_7$, $R_2Co_{17}$, $RCo_3$, $RCo_{4-x}B_x$, and $RCo_{4-x}Ga_x$.

Next, reference will be made to a thermoelectric conversion device in which the thermoelectric conversion element of the embodiments is modularized.

Example 1

Figure 12:
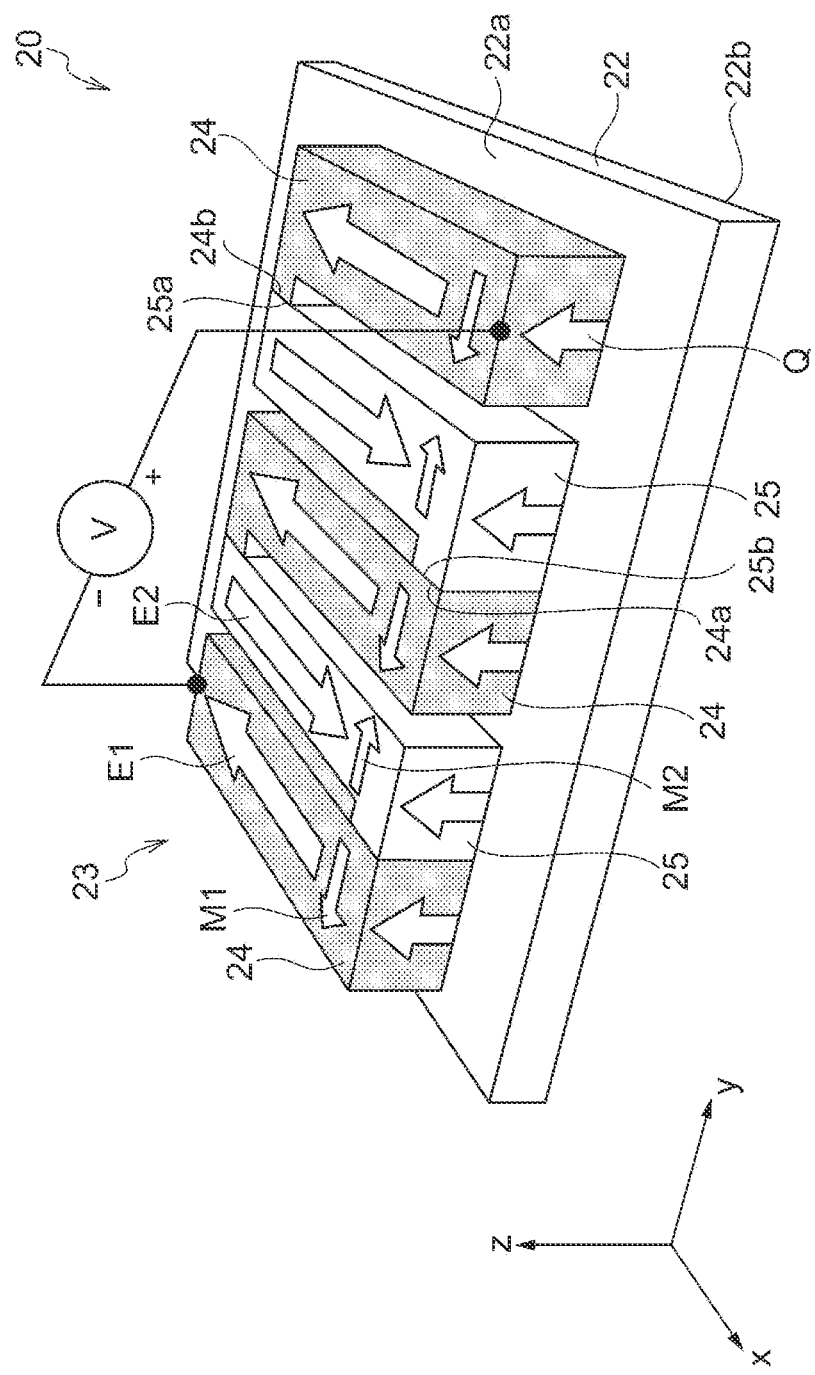
FIG. 12 is a perspective view illustrating a configuration of a thermoelectric conversion device according to Example 1 including the thermoelectric conversion elements of the embodiments.

FIG. 12 shows an external configuration of a thermoelectric conversion device 20 according to Example 1 of the embodiments. The thermoelectric conversion device 20 includes a substrate 22 and a power generator 23 placed on the substrate 22. In the thermoelectric conversion device 20, when a heat current Q flows from the substrate 22 side toward the power generator 23, a temperature difference is created in a heat current direction in the power generator 23, and the anomalous Nernst effect generates an electric voltage V in the power generator 23.

The substrate 22 has a first surface 22a on which the power generator 23 is placed, and a second surface 22b opposite to the first surface 22a. Heat from a heat source (not shown) is applied to the second surface 22b. Examples of a material of the substrate 22 include, but are not limited to, MgO, Si, and $Al_2O_3$.

The power generator 23 includes a plurality of thermoelectric conversion elements 24 and a plurality of thermoelectric conversion elements 25, and each of the thermoelectric conversion elements has an L-shaped three-dimensional shape and is made of $Fe_3Sn_2$, the iron nitride ($Fe_{16}N_2$ or $Fe_4N$), or the R—Co based alloy described above. As shown in FIG. 12, the plurality of thermoelectric conversion elements 24 and the plurality of thermoelectric conversion elements 25 are alternately arranged in parallel on the substrate 22 in a direction (y direction) perpendicular to a longitudinal direction (x direction) of each of the thermoelectric conversion elements. The number of the thermoelectric conversion elements 24 and the thermoelectric conversion elements 25 constituting the power generator 23 are not limited.

The plurality of thermoelectric conversion elements 24 and the plurality of thermoelectric conversion elements 25 are arranged such that a direction of magnetization M1 of the thermoelectric conversion elements 24 is opposite to a direction of magnetization M2 of the thermoelectric conversion elements 25. The Nernst coefficient of the plurality of thermoelectric conversion elements 24 has the same sign as that of the plurality of thermoelectric conversion elements 25.

The thermoelectric conversion element 24 has a first side surface (+y side) and a second side surface (−y side) in the longitudinal direction (x direction), and a first end (+x side) on the first side surface (+y side) is defined as a first end face 24a, and a second end (−x side) on the second side surface (−y side) is defined as a second end face 24b. The thermoelectric conversion element 25 has a first side surface (+y side) and a second side surface (−y side) in the longitudinal direction (x direction), and a second end (−x side) on the first side surface (+y side) is defined as a first end face 25a, and a first end (+x side) on the second side surface (−y side) is defined as a second end face 25b.

The first end face 25a of the thermoelectric conversion element 25 is connected to the second end face 24b of the adjacent thermoelectric conversion element 24 on the +y side, and the second end face 25b of the thermoelectric conversion element 25 is connected to the first end face 24a of the adjacent thermoelectric conversion element 24 on the opposite side (−y side). With this structure, the plurality of thermoelectric conversion elements 24 and the plurality of thermoelectric conversion elements 25 are electrically connected in series. That is, the power generator 23 is provided in a serpentine shape on the first surface 22a of the substrate 22. The thermoelectric conversion elements 24 and the thermoelectric conversion elements 25 are insulated from each other except for the connection points.

When heat from the heat source is applied to the second surface 22b of the substrate 22, the heat current Q flows in the +z direction toward the power generator 23. When the heat current Q creates the temperature difference, the anomalous Nernst effect generates an electromotive force E1 in a direction (−x direction) orthogonal to both the direction of the magnetization M1 (−y direction) and the direction of the heat current Q (+z direction) in the thermoelectric conversion elements 24. In the thermoelectric conversion elements 25, the anomalous Nernst effect generates an electromotive force E2 in a direction (+x direction) orthogonal to both the direction of the magnetization M2 (+y direction) and the direction of the heat current Q (+z direction).

As described above, since the thermoelectric conversion elements 24 and the thermoelectric conversion elements 25, which are arranged in parallel, are electrically connected in series, the electromotive force E1 generated in one thermoelectric conversion element 24 can be applied to the adjacent thermoelectric conversion elements 25. In addition, since the direction of the electromotive force E1 generated in one thermoelectric conversion element 24 is opposite to that of the electromotive force E2 generated in the adjacent thermoelectric conversion elements 25, the electromotive force in the thermoelectric conversion elements 24 and the electromotive force in the adjacent thermoelectric conversion elements 25 are added up, thereby increasing an output voltage V.

A modified configuration of the thermoelectric conversion device 20 of FIG. 12 may be employed such that the Nernst coefficient of the thermoelectric conversion element 24 is opposite in sign to that of the adjacent thermoelectric conversion element 25, and the plurality of thermoelectric conversion elements 24 and the plurality of thermoelectric conversion elements 25 share the same magnetization direction (that is, the magnetization M1 and the magnetization M2 have the same direction).

Example 2

Figure 13:
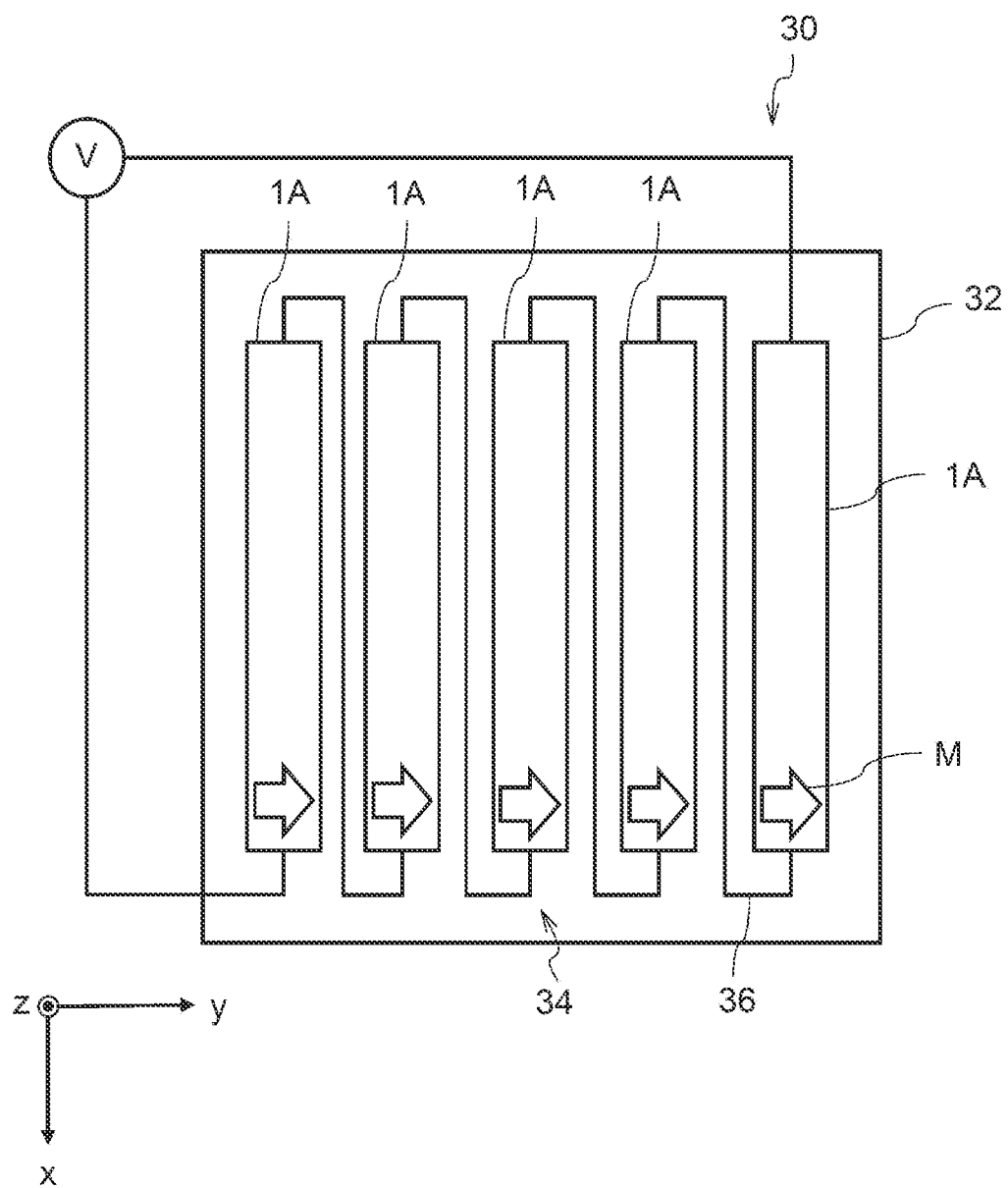
FIG. 13 is a plan view illustrating a configuration of a thermoelectric conversion device according to Example 2 including the thermoelectric conversion elements of the embodiments.

FIG. 13 is a plan view of a thermoelectric conversion device 30 according to Example 2 of the embodiments. The thermoelectric conversion device 30 includes, as a power generator 34, a plurality of rectangular parallelepiped-shaped thermoelectric conversion elements 1A having Nernst coefficients with the same sign. Each of the thermoelectric conversion elements 1A is made of $Fe_3Sn_2$, the iron nitride, or the R—Co based alloy described above.

The plurality of thermoelectric conversion elements 1A are arranged in parallel on a substrate 32 in a direction (y direction) perpendicular to the longitudinal direction (x direction) such that they share the same direction of the magnetization M (y direction). Each thermoelectric conversion element 1A has a first end (+x side) and a second end (−x side), and the first end of one thermoelectric conversion element 1A is connected to the second end of the adjacent thermoelectric conversion element 1A on the −y side via a copper wiring 36, and thus the plurality of thermoelectric conversion elements 1A are electrically connected in series. Examples of a material of the substrate 32 include, but are not limited to, MgO, Si, and $Al_2O_3$.

The heat current flows from the substrate 32 side toward the power generator 34 (in a +z direction). Since the thermoelectric conversion device 30 has a configuration in which the adjacent thermoelectric conversion elements 1A are connected to each other via the copper wiring 36, the thermoelectric conversion device 30 can be manufactured more easily than the thermoelectric conversion device 20 of Example 1 shown in FIG. 12.

Example 3

The thermoelectric mechanism using the anomalous Nernst effect allows the temperature gradient, the magnetization direction, and the direction of the electric voltage to be orthogonal to one another, which makes it possible to produce a thin sheet-shaped thermoelectric conversion element.

Figure 14:
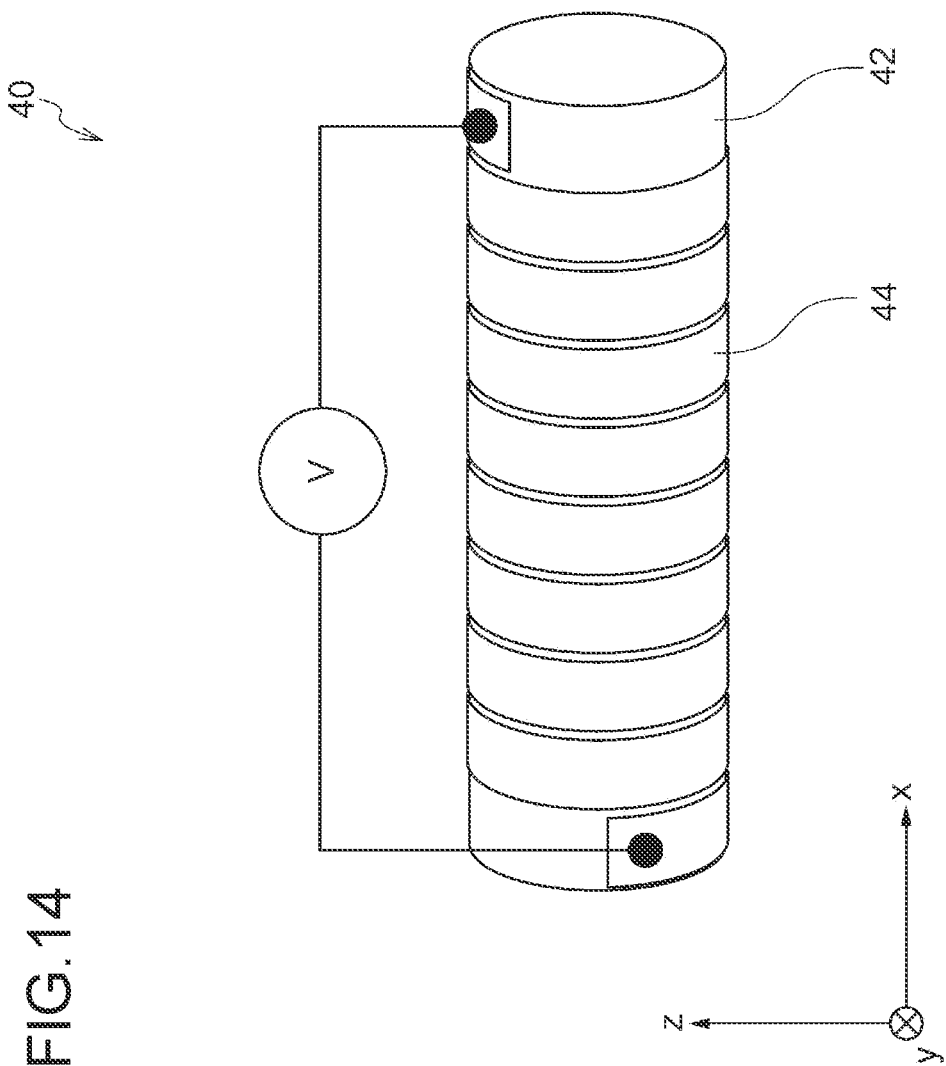
FIG. 14 is an external view illustrating a configuration of a thermoelectric conversion device according to Example 3 including the thermoelectric conversion element of the embodiments.

FIG. 14 shows an external configuration of a thermoelectric conversion device 40 according to Example 3 including a sheet-shaped thermoelectric conversion element 44. Specifically, the thermoelectric conversion device 40 includes a hollow member 42 and the elongated sheet-shaped (tape-shaped) thermoelectric conversion element 44 winding around the hollow member 42 to cover an outer surface of the hollow member 42. The thermoelectric conversion element 44 is made of $Fe_3Sn_2$, the iron nitride, or the R—Co based alloy described above.

The magnetization of the thermoelectric conversion element 44 is parallel to a longitudinal direction (x direction) of the hollow member 42. When the heat current flows from the inside toward the outside of the hollow member 42 and creates the temperature gradient, the anomalous Nernst effect generates an electric voltage V along a longitudinal direction of the elongated thermoelectric conversion element 44 (i.e., along a direction perpendicular to both the magnetization direction and the direction of the heat current).

Instead of the elongated sheet-shaped thermoelectric conversion element 44 of the thermoelectric conversion device 40 of FIG. 14, a wire-rod thermoelectric conversion element may be wound around the hollow member 42.

Here, in FIGS. 12 to 14, let the longitudinal length of the thermoelectric conversion element (s) be denoted by L and a thickness (height) of the thermoelectric conversion element(s) be denoted by H. The electric voltage generated by the anomalous Nernst effect is proportional to L/H. That is, the longer and thinner the thermoelectric conversion element(s), the larger the generated electric voltage. Therefore, the anomalous Nernst effect is expected to be enhanced by employing the power generator having the thermoelectric conversion elements which are electrically connected in series, or employing the wire-rod thermoelectric conversion element or the elongated sheet-shaped thermoelectric conversion element.

The thermoelectric conversion devices described in Examples 1 to 3 are applicable to various fields. Specific examples of such applications include stand-alone power supplies for Internet of Things (IoT) sensors or heat flux sensors, in a temperature range between room temperature and several hundred degrees Celsius.

For example, by applying the thermoelectric conversion device of the embodiments to a heat flux sensor, it is possible to determine whether thermal insulation performance of a building is good or bad. By providing the thermoelectric conversion device in an exhaust device of a motor vehicle, it is possible to convert heat from exhaust gas (waste heat) into electricity, and to effectively use the thermoelectric conversion device as an auxiliary power supply. Further, by arranging heat flux sensors in a mesh-like pattern on a wall surface of a certain space, it is possible to perform space recognition of heat current or heat sources. This technique is expected to be applicable to, for example, a high-precision temperature control of high-density crop cultivation or livestock growth, or to a driver detection system for automatic driving. The heat flux sensors can also be used in room air conditioning management, or core body temperature management in medical treatment. In addition, the thermoelectric conversion element of the embodiments can be formed into powder or paste, thus offering promising applications in a wide range of fields.

The embodiments have focused on the electric voltage generated by the anomalous Nernst effect. In practice, the output voltage can be increased by synergy among the electric voltage generated by the Seebeck effect resulting from the temperature gradient, the Hall effect that occurs based on the electric voltage generated by the Seebeck effect, and the electric voltage generated by the anomalous Nernst effect.

REFERENCE SIGN LIST

1, 1A, 24, 25, 44: thermoelectric conversion element
20, 30, 40: thermoelectric conversion device
22, 32: substrate
23, 34: power generator
42: hollow member

The invention claimed is:

1. A thermoelectric conversion element made of $Fe_3Sn_2$ exhibiting an anomalous Nernst effect, wherein
   an absolute value of a Nernst coefficient of $Fe_3Sn_2$ increases with an increase in temperature for a temperature exceeding 150 K.

2. The thermoelectric conversion element according to claim 1, wherein
   the absolute value of the Nernst coefficient of $Fe_3Sn_2$ increases with an increase in temperature for a temperature of 300 K or higher.

3. A thermoelectric conversion device comprising:
   a substrate; and
   a plurality of thermoelectric conversion elements on the substrate, wherein
   each of the plurality of thermoelectric conversion elements is defined as the thermoelectric conversion element according to claim 1, and has a shape extending in one direction, and
   the plurality of thermoelectric conversion elements are arranged in parallel in a direction perpendicular to the one direction and electrically connected in series.

4. The thermoelectric conversion device according to claim 3, wherein the plurality of thermoelectric conversion elements are arranged in a serpentine shape.

5. A thermoelectric conversion device comprising:
   a hollow member; and
   the thermoelectric conversion element according to claim 1, the thermoelectric conversion element being a sheet-shaped element or a wire rod covering an outer surface of the hollow member.

6. A thermoelectric conversion element made of $RCo_5$ where R is a rare-earth element, wherein
   the rare-earth element is one of Y, La, Ce, Pr, Nd, Gd, Tb, Dy, Ho, and Er, and
   the $RCo_5$ exhibits an anomalous Nernst effect.

7. A thermoelectric conversion element
   made of $RCo_4M$ where R is a rare-earth element and M is B or Ga, wherein
   the rare-earth element is one of Y, La, Ce, Pr, Nd, Gd, Tb, Dy, Ho, and Er, and
   the $RCo_4M$ exhibits an anomalous Nernst effect.

8. A thermoelectric conversion element made of $Fe_{16}N_2$ and exhibiting an anomalous Nernst effect.

9. A thermoelectric conversion device comprising:
   a substrate; and
   a plurality of thermoelectric conversion elements on the substrate, wherein
   each of the plurality of thermoelectric conversion elements is defined as the thermoelectric conversion element according to claim 8, and has a shape extending in one direction, and
   the plurality of thermoelectric conversion elements are arranged in parallel in a direction perpendicular to the one direction and electrically connected in series.

10. The thermoelectric conversion device according to claim 9, wherein the plurality of thermoelectric conversion elements are arranged in a serpentine shape.

11. A thermoelectric conversion device comprising:
a hollow member; and
the thermoelectric conversion element according to claim 8, the thermoelectric conversion element being a sheet-shaped element or a wire rod covering an outer surface of the hollow member.

\* \* \* \* \*